July 10, 1956 H. JOHNSON 2,754,431

SEMICONDUCTOR DEVICES

Filed March 9, 1953

INVENTOR.
Harwick Johnson
BY J. L. Whittaker
ATTORNEY

United States Patent Office 2,754,431

Patented July 10, 1956

2,754,431

SEMICONDUCTOR DEVICES

Harwick Johnson, Princeton, N. J., assignor to Radio Corporation of America, a corporation of Delaware Application March 9, 1953, Serial No. 341,161

17 Claims. (Cl. 307—88.5)

This invention pertains to semiconductor devices and particularly to methods for varying the electrical characteristics of such devices and controlling their operation thereby.

One type of semiconductor device, such as a transistor, may comprise a body of semiconductor material having zones of N-type and of P-type conductivity. These zones are separated by a rectifying barrier which has high resistance to electrical charge flow in one direction and low resistance in the reverse direction. Such devices, generally, have three distinct zones or regions arranged either in P—N—P or N—P—N order. In the former configuration the P-type zones are operated as the emitter and collector electrodes while the N-type zone constitutes the base portion or base electrode. In the latter configuration, the N-type regions comprise the emitter and collector electrodes and the P-type region is the base electrode. In operation of these devices, the emitter electrode injects minority charge carriers into the base region and the carriers are collected by the collector electrode. The flow of charge carriers is controlled by an input signal which is applied either to the emitter or base electrode.

The resistance of the base portion of a transistor is a function of the resistivity of the material and the length of the electrical path therethrough. This resistance, denoted the base resistance of the device, is an important operating parameter and may control, for example, the high frequency response of a transistor.

In certain instances it may be desirable to be able to vary the base resistance of a transistor, for example, in response to a signal. Or, more broadly, it may be desirable to be able to vary the resistance of a piece of semiconductor material used as a current conduit in devices other than transistors.

An important object of this invention is to provide a semiconductor device of new and improved form.

Another object is to provide an improved semiconductor device having an electrical current path, the conductivity of which may be varied.

A further object is to provide an improved semiconductor device having means for varying the electrical resistance of a portion thereof.

A still further object is to provide an improved transistor having means for varying the base resistance thereof.

In general, the present invention comprises improved means for controlling passage of current through a body of semiconductor material. The control means includes a control zone of conductivity type opposite that of the body of the material, provided adjacent the current path through the body and separated from the body by a P—N rectifying barrier. The control zone is provided with biasing means whereby the zone may be biased in either a reverse direction or a forward direction with respect to the body of the device. With reverse bias applied to the control zone, the effective area of the rectifying barrier is extended into the current path of the body of the device and the resistance of the body adjacent the barrier is effectively increased. If the control zone is biased in the forward direction, minority charge carriers are injected into the body of the device and the conductivity of that part of the body adjacent the rectifying barrier is thereby increased.

In accordance with the present invention, this control principle may be used to vary the base resistance of a point-contact or junction-type transistor or other devices utilizing P—N rectifying junctions.

The invention is described with reference to the drawings wherein.

Similar elements are designated by similar reference numerals throughout the drawings.

Figure 1:
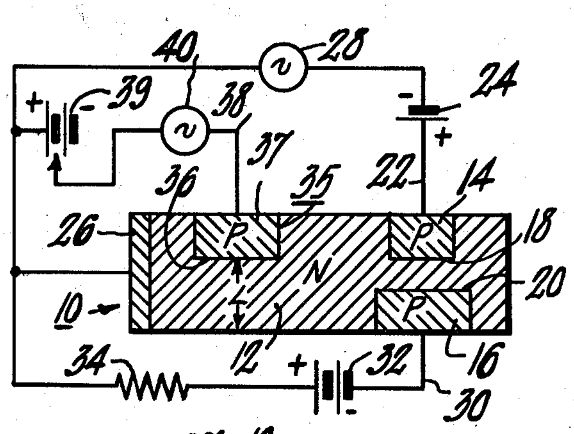
Fig. 1 is an elevational, cross-sectional view of one type of semiconductor device to which the principles of the invention may be applied and a schematic representation of a circuit in which the device may be employed.
Figure 2:
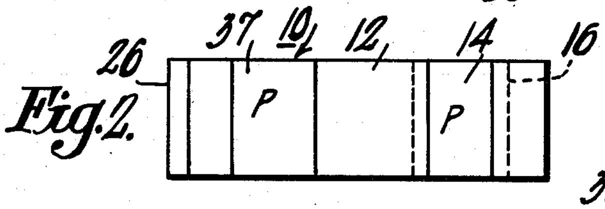
Fig. 2 is a plan view of the device shown in Fig. 1.

Referring to Figures 1 and 2, a semiconductor device 10, specifically a typical P—N—P transistor, is modified according to the principles of the invention. It is to be understood that the principles of the invention wherever described with reference to a P—N—P transistor may be similarly applied to an N—P—N transistor. The device 10 comprises a body 12 of N-type germanium or silicon or the like, preferably germanium, having two P-type conductivity regions 14 and 16 which may be formed therein according to a method described in U. S. Patent 2,588,254 to K. Lark-Horowitz et al. According to this method, a body of N-type is suitably masked and bombarded with charged nucleons whereby the bombarded regions are converted to P-type material. The P-type regions are separated from the remainder of the body 12 by rectifying barriers 18 and 20 which are generally planar in form.

Alternatively, the P-type regions and rectifying barriers may be formed by alloying small portions of a metal, such as indium, capable of imparting P-type conductivity characteristics to the germanium, into opposite surfaces of the germanium body. This alloying method is described and claimed by C. W. Mueller in his U. S. patent application, Serial Number 295,304, filed June 24, 1952 and assigned to the assignee of this application. In a preferred construction of the invention, the P—N junctions are substantially planar in form. Such alloyed junctions may be made according to the teaching of L. D. Armstrong in his U. S. patent application, Serial No. 291,355, filed June 2, 1952 and assigned to the assignee of this application. Briefly, according to Armstrong's method, substantially plane and parallel P—N junctions are formed by alloying a suitable impurity material through a coating of metal plated on opposite surfaces of the germanium crystal. The metal is selected for its ability to alloy with the impurity material used and if the impurity is indium, the metal may be any one of gold, copper, silver, or nickel.

The above-described device may be employed as a typical transistor. In transistor operation one of the P-type regions, e. g. 14, is utilized as an emitter electrode and is biased in the forward, or easy current flow, direction with respect to the N-type body by a connection 22 to the positive pole of a battery 24. The negative pole of the battery 24 is connected to a comparatively large area metal plate 26 soldered in ohmic contact to the body 12 and operated as base electrode. An input signal source 28 is connected in series with the battery 24 to apply signals between the base electrode 26 and the emitter electrode 14. The other P-type region 16 is operated as the collector electrode and is biased in the reverse direction with respect to the N-type body by a connection 30 to the negative pole of a second battery 32. The positive pole of the battery 32 is connected to the base electrode 26 through a load impedance 34. The base resistance of the device is determined by the resistivity of the N-type body and the extent of that body between the base electrode 26 connected thereto and the P—N junctions 14 and 16.

According to the invention, means are provided for varying the effective resistance of the base region or base electrode of the device 10. This means may comprise a control P—N junction 35 formed in the body of the device and including a rectifying barrier 36 and a P-type region 37. The P—N junction 35 may be prepared according to any of the methods described above. The method selected should provide, preferably, a rectifying barrier 36 which is substantially plane and substantially parallel to the current path through the semiconductor body between the base electrode 26 and the emitter and collector electrodes 14 and 16 respectively. Such a construction provides optimum control. The control P—N junction 35 also, preferably, comprises a band extending completely across the width of the body as shown in Figure 2.

In operation of the P—N junction 35 as a control mechanism in the device 10, a reverse electrical bias is applied thereto to establish the desired operating point of the junction. To this end, a lead 38 is soldered to the region 37 and is connected to the negative pole of a control battery 39, the positive pole of which is connected to the base electrode 26. The battery 39 may be adapted to provide a variable reverse bias to the region 37. As a further development according to the invention, a second signal source 40 may be connected in circuit with the zone 37 to apply a variable signal thereto and to vary the base resistance thereby in accordance with variations of the signal source. The bias from the battery 39 and the signal from the source 40 are of such relative magnitude that the region 37 is always maintained at a reverse bias. The latter arrangement may be used for volume control, modulation or the like.

The mechanism by which the base resistance is thus varied is believed to be as follows.

The reverse voltage applied to the P-type region 37 and its associated rectifying barrier 36 by the control battery 39 causes the space charge associated with the barrier to penetrate deeper into the N-type body 12 and thus effectively reduce the cross-sectional area of the available current path through the base region. Thus the resistance of the base region of the body is increased. The variable control signal applied to the P-type control region 37 causes the rectifying barrier effectively to expand or contract according to its amplitude variations. As the signal increases in magnitude in a negative direction, the barrier expands and the resistance of the base region increases. Correspondingly the current flow from the emitter to the collector decreases since more of the emitter-to-base signal voltage appears across the base region and less voltage appears at the emitter junction. Similarly, if the control signal increases in a positive direction the rectifying barrier contracts, the resistance of the base region decreases and the emitter-to-collector current increases.

Figure 3:
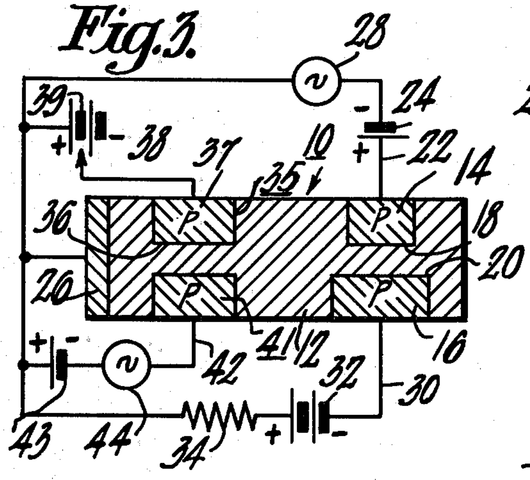
Fig. 3 is an elevational, cross-sectional view of a first modification of the device shown in Fig. 1 and a schematic representation of a circuit in which the device may be employed.

In the modification of the invention illustrated in Figure 3, the device shown is similar to that shown in Figure 1 except that a fourth or additional control P—N junction region 41 is provided for varying the resistance of the base region. The fourth P—N junction 41 also comprises a band extending across the width of the device substantially vertically aligned with and substantially parallel to the control junction 35. In operation of this device one of the P—N control junctions, e. g. 41, is biased at a desired operating reverse potential by a connection 42 to the negative pole of a fourth battery 43, the positive pole of which is connected to the base electrode 26. A signal source 44 is connected in circuit with one of the control junctions, e. g. 41. As the control signal varies in amplitude the P—N junction 41 varies its effective penetration into the body 12 and the resistance of the base region varies correspondingly. The emitter-to-collector current is thereby controlled. An advantage of the construction shown in Figure 3 is that the control junctions 35 and 41 may be positioned close together and effective control by a small signal may be more readily achieved. If desired, both junctions 35 and 41 may be used to provide control. To this end, the same or different variable control signals are applied to the two control junctions.

Figure 4:
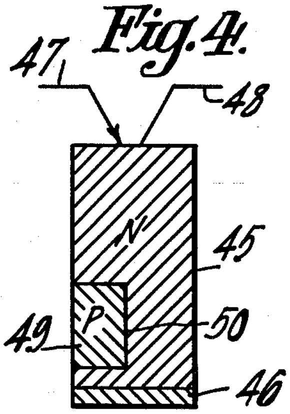
Fig. 4 is an elevational view, partly in section, of a second modification of the invention.

The principles of the invention described above with respect to a typical P—N—P junction type transistor may also be applied to point-contact transistors or to the type of transistor known as the P—N hook or P—N—P—N transistor. A point contact transistor modified according to the principles of the invention is shown in Figure 4 and comprises a body of semiconductor material 45, e. g. N-type germanium, having a base electrode 46 and two point contact electrodes 47 and 48. According to the invention and as described above, the N-type body has a P-type control zone 49 and a rectifying barrier 50 formed therein. As described above, the P-type zone may be utilized to vary the resistance of the base region and thereby to control the current flow therethrough.

Figures 5, 7:
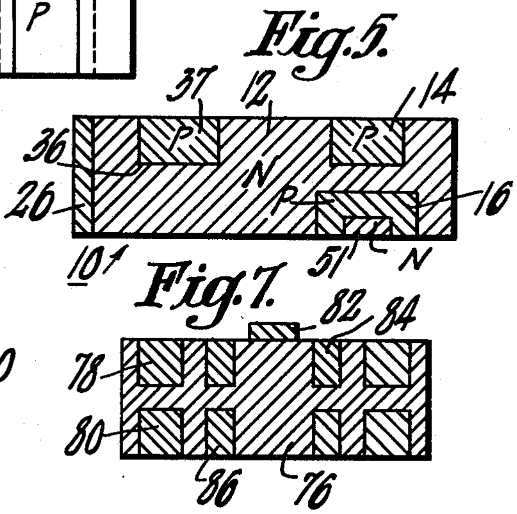
Fig. 5 is a sectional, elevational view of a third modification of the invention.
Fig. 7 is a sectional, elevational view of a fifth modification of the invention; and, Fig. 8 is a plan view of the device shown in Fig. 7.

A P—N—P—N device may be made from the device shown in Figure 1 and may have the configuration shown in Figure 5. The device may be made by forming an N-type conductivity zone 51 in one of the P-type zones, e. g. 16, by alloying a quantity of a suitable impurity material such as antimony therewith.

Figure 6:
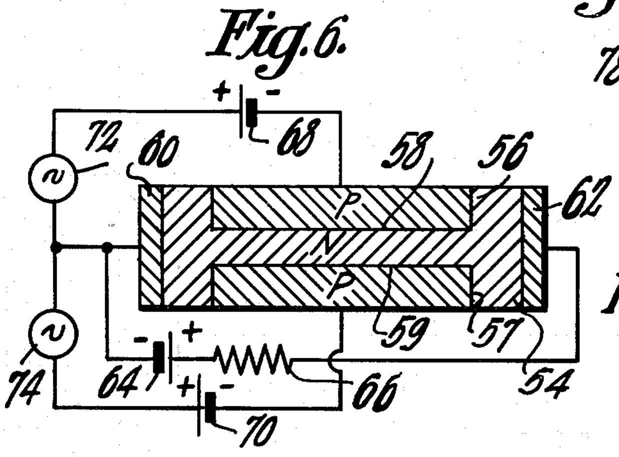
Fig. 6 is a sectional, elevational view of a fourth modification of the invention.

In a further embodiment of the invention shown in Figure 6, there is illustrated a semi-conductor device which may be utilized as a phase detector or phase comparator. The device comprises a wafer or crystal 54 of semiconductor material, for example N-type conductivity germanium, which is employed as a unipolar current conduit and which is provided with means for varying its conductivity in accordance with an input signal. (The term "unipolar" signifies that the working current comprises only one type of charge carrier.) In accordance with the invention, two P—N junctions 56 and 57 including rectifying barriers 58 and 59 respectively are formed beneath opposite surfaces of the wafer 54. Large area metal plates or base electrodes 60 and 62 are soldered to the ends of the wafer and in ohmic contact therewith. An electrical circuit is established between the electrodes 60 and 62, and includes a battery or other source of electrical current 64 and a load impedance 66 or other form of utilization device. Each of the junctions 56 and 57 is biased at an operating point in the reverse direction with respect to the N-type body by connections to the negative poles of batteries 68 and 70 respectively. A first signal source 72 is connected between the positive pole of the battery 68 and one of the end or base electrodes, e. g. electrode 60. Another signal source 74 is connected between the positive terminal of the battery 70 and the electrode 60. In operation of the device, the operating or effective D.-C. resistance of the wafer 54 and the D.-C. current therethrough are established by penetration of the rectifying barriers 58 and 59 due to the voltages applied from the batteries 68 and 70. If the signals from the sources 72 and 74 are opposite in phase and have the same amplitude, one barrier contracts and the other expands approximately the same amount and no output signal results. If the signals are of the same amplitude, in phase and negative, both barriers expand and the base resistance is increased to a maximum. Thus the signal is reduced to a minimum. If both signals are in phase and at a positive maximum, both barriers contract, the resistance is a minimum and the signal is a maximum.

Figure 8:
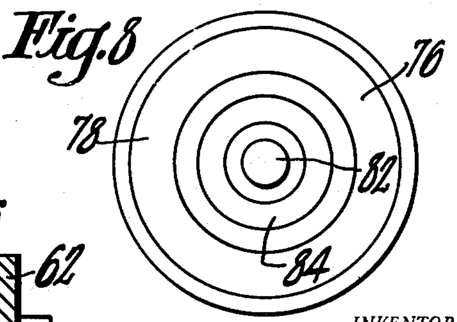

The principles of the invention may also be applied to semiconductor devices arranged in a generally circular form. One such construction essentially corresponding in function to the device shown in Figure 3 is shown in Figures 7 and 8. It includes a disk 76 of semiconductor material having annular P—N junctions 78 and 80 formed therein on opposite surfaces of the disk. The junctions 78 and 80 may be operated as the emitter and collector electrodes of a transistor. A base electrode 82 is bonded to the disk centered within one of the junction electrodes, e. g. 78. Annular control P—N junctions 84 and 86 are formed in the disk between the base electrode 82 and the junction electrodes 78 and 80 and are employed to control the transistor operation in the same way that the junctions 35 and 41 are employed in Figure 3.

The method of operation described above may be varied to achieve the same results. Such variation comprises biasing the control junctions (35, 41, 56, 57) in the forward direction with respect to the adjacent region whose resistance is to be controlled or varied. With this arrangement, minority charge carriers are injected into the region to be controlled and the conductance of the current path is varied accordingly with the conductance increasing with injected charge. As the conductance increases, the resistance decreases. In this construction, however, and referring to Figure 1, for example, the distance "L" between the barrier 36 and the opposite surface of the crystal 12 should be of the order of the diffusion length of the injected charges. The diffusion length is approximately the distance an injected charge will travel before it recombines with a charge of the opposite sign and disappears. With this condition satisfied, the charges diffuse through the thickness of the body 12 and recombine with charges of opposite sign at the surface of the crystal. By this process, the conductance of substantially the entire current path through the crystal is appropriately affected. If the crystal is considerably thicker than the diffusion length, the desired conductance variation is not effected since the charges diffuse only a distance "L" and affect the conductance of only that region while the remainder of the thickness of the crystal and the current path is not affected.

If desired, any of the embodiments of the invention described above as being controlled by a reverse biased P—N junction electrode may also be controlled by a forward biased junction operating by means of charge injection.

What is claimed is:

1. An electrical device comprising a body of semiconductor material, emitter and collector electrodes in contact with said body, a base electrode also in contact with said body such that a current path is defined between said base electrode and one of said emitter or collector electrodes, and means for varying the effective resistance of a portion of said body within said current path, said means comprising a P—N rectifying junction electrode disposed adjacent said path, and means for biasing said junction electrode in a particular direction with respect to said body.

2. An electrical device comprising a body of semiconductor material, emitter and collector electrodes in contact with said body, a base electrode also in contact with said body such that a current path is defined between said base electrode and one of said emitter or collector electrodes, and means for varying the effective resistance of a portion of said body with said current path, said means comprising a P—N rectifying junction electrode disposed adjacent said path and remote from said emitter and collector electrodes, and means for biasing said junction electrode in a particular direction with respect to said body.

3. An electrical device comprising a body of semiconductor material, emitter and collector electrodes in contact with said body, a base electrode also in contact with said body such that a current path is defined between said base electrode and one of said emitter or collector electrodes and means for varying the effective resistance of a portion of said body within said current path, said means comprising a P—N rectifying junction control electrode disposed adjacent said path and intermediate the ends of said path, and means for biasing said junction control electrode in a particular direction with respect to said body.

4. An electrical device comprising a body of semiconductor material, emitter and collector electrodes in contact with said body, a base electrode also in contact with said body such that a current path is defined between said base electrode and one of said emitter or collector electrodes and means for varying the effective resistance of a portion of said body within said current path, said means comprising a P—N rectifying junction control electrode disposed adacent said path and intermediate the ends of said path, means for biasing said junction control electrode in a particular direction with respect to said body, and signal modulation means connected to said junction control electrode.

5. An electrical device comprising a body of semiconductor material, emitter and collector electrodes in contact with said body, a base electrode also in contact with said body such that a current path is defined between said base electrode and one of said emitter or collector electrodes, and means for varying the effective resistance of a portion of said body within said current path, said means comprising a pair of P—N junction electrodes disposed adjacent to said path on opposite sides thereof and aligned in substantially parallel planes, means for biasing said junction electrodes in a particular direction with respect to said body.

6. An electrical device comprising a body of semiconductor material, emitter and collector electrodes in contact with said body, a base electrode also in contact with said body such that a current path is defined between said base electrode and one of said emitter or collector electrodes, and means for varying the effective resistance of a portion of said body within said current path, said means comprising a pair of P—N junction electrodes disposed remote from said emitter and collector electrodes and adjacent to said path on opposite sides thereof and aligned in substantially parallel planes, means for biasing said junction electrodes in a particular direction with respect to said body.

7. An electrical device comprising a body of semiconductor material, emitter and collector electrodes in contact with said body, a base electrode also in contact with said body such that a current path is defined between said base electrode and one of said emitter or collector electrodes, and means for varying the effective resistance of a portion of said body within said current path, said means comprising a pair of P—N junction electrodes disposed adjacent to said path on opposite sides thereof and intermediate the ends of said path and aligned in substantially parallel planes, means for biasing said junction electrodes in a particular direction with respect to said body.

8. An electrical device comprising a body of semiconductor material, emitter and collector electrodes in contact with said body, a base electrode also in contact with said body such that a current path is defined between said base electrode and one of said emitter or collector electrodes, and means for varying the effective resistance of a portion of said body within said current path, said means comprising a P—N rectifying junction electrode disposed adjacent said path and intermediate the ends of said path, and means for biasing said junction electrode in the reverse direction with respect to said body.

9. An electrical device comprising a body of semiconductor material, emitter and collector electrodes in contact with said body, a base electrode also in contact with said body such that a current path is defined between said base electrode and one of said emitter or collector electrodes, and means for varying the effective resistance of a portion of said body within said current path, said means comprising a P—N rectifying junction electrode disposed adjacent said path and intermediate the ends of said path, and means for biasing said junction electrode in the forward direction with respect to said body, whereby minority charge carriers are injected into said body is thereby varied, the thickness of said body in the vicinity of said junction electrode being of the order of a diffusion length for said charge minority carriers.

10. An electrical device comprising a body of semiconductor material, emitter and collector electrodes in contact with said body, a base electrode also in contact with said body such that a current path is defined between said base electrode and one of said emitter or collector electrodes, and means for varying the effective resistance of a portion of said body within said current path, said means comprising a pair of P—N junction electrodes disposed adjacent to said path on opposite sides thereof and intermediate the ends of said path and aligned in substantially parallel planes, means for biasing said junction electrodes in the reverse direction with respect to said body.

11. An electrical device comprising a body of semiconductor material, emitter and collector electrodes in contact with said body, a base electrode also in contact with said body such that a current path is defined between said base electrode and one of said emitter or collector electrodes, and means for varying the effective resistance of a portion of said body within said current path, said means comprising a P—N rectifying junction electrode disposed adjacent said path and intermediate the ends of said path, and means for biasing said junction electrode in a particular direction with respect to said body, and means connected to said junction electrode for varying the bias on said electrode.

12. An electrical device comprising a body of semiconductor material, emitter and collector electrodes in contact with said body, a base electrode also in contact with said body such that a current path is defined between said base electrode and one of said emitter or collector electrodes, and means for varying the effective resistance of a portion of said body within said current path, said means comprising a pair of P—N junction electrodes disposed adjacent to said path on opposite sides thereof and intermediate the ends of said path and aligned in substantially parallel planes, means for biasing said junction electrodes in a particular direction with respect to said body and means connected to at least one of said junction electrodes for varying the bias thereon.

13. An electrical device comprising a body of semiconductor material, emitter and collector electrodes in contact with said body, a base electrode also in contact with said body such that a current path is defined between said base electrode and one of said emitter or collector electrodes, and means for varying the effective resistance of a portion of said body within said current path, said means comprising a pair of P—N junction control electrodes disposed adjacent to said path on opposite sides thereof and intermediate the ends of said path and aligned in substantially parallel planes, means for biasing said junction control electrodes in a particular direction with respect to said body, and means connected to one of said junction control electrodes for varying the bias thereon.

14. An electrical device comprising a body of semiconductor material, emitter and collector electrodes in contact with said body, a base electrode also in contact with said body such that a current path is defined between said base electrode and one of said emitter or collector electrodes, and means for varying the effective resistance of a portion of said body within said current path, said means comprising a pair of P—N junction control electrodes disposed adjacent to said path on opposite sides thereof and intermediate the ends of said path and aligned in substantially parallel planes, means for biasing said junction control electrodes in a particular direction with respect to said body, and signal modulation means connected to one of said control electrodes.

15. A semiconductor device comprising a body of semiconductor material, a transistor formed therein including annular emitter and collector P—N junction electrodes, an additional annular P—N junction electrode present in said body, and a bias voltage and a signal source connected thereto for varying the resistance of said body.

16. An electrical device comprising a body of semiconductor material, a first electrode in rectifying contact with one surface of said body, a second electrode in nonrectifying contact with said body remote from said first electrode, said first and second electrodes defining the terminals of a current path in said body, and a third electrode in rectifying contact with another surface of said body between said first and second electrodes and adapted to vary the resistance of said current path, said third electrode comprising a P—N junction biased in the reverse direction with respect to said body.

17. An electrical device comprising a body of semiconductor material, a first electrode in rectifying contact with one surface of said body, a second electrode in nonrectifying contact with said body remote from said first electrode, said first and second electrodes defining the terminals of a current path in said body, and a third electrode in rectifying contact with another surface of said body between said first and second electrodes and adapted to vary the resistance of said current path, said third electrode being biased in the forward direction with respect to said body.

References Cited in the file of this patent

UNITED STATES PATENTS

| | | |
|---|---|---|
| 2,597,028 | Pfann | May 20, 1952 |
| 2,624,016 | White | Dec. 30, 1952 |
| 2,683,840 | Welker | July 13, 1954 |